(12) United States Patent
Alabastro et al.

(10) Patent No.: US 10,769,855 B2
(45) Date of Patent: Sep. 8, 2020

(54) PERSONNEL MOVEMENT SIMULATION AND CONTROL

(71) Applicant: ACCENTURE GLOBAL SOLUTIONS LIMITED, Dublin (IE)

(72) Inventors: Arnold James Cristi Alabastro, Cainta Rizal (PH); Jedrick Lu Chua, Makati (PH); Jonathan Jason Co King Li, Quezon (PH); Alvine Garcia Aurelio, Pasig (PH); Camille Marianne Reyes Occeño, San Pedro (PH)

(73) Assignee: ACCENTURE GLOBAL SOLUTIONS LIMITED, Dublin (IE)

( * ) Notice: Subject to any disclaimer, the term of this patent is extended or adjusted under 35 U.S.C. 154(b) by 0 days.

(21) Appl. No.: 16/038,962

(22) Filed: Jul. 18, 2018

(65) Prior Publication Data

US 2019/0026949 A1    Jan. 24, 2019

Related U.S. Application Data

(60) Provisional application No. 62/535,710, filed on Jul. 21, 2017.

(51) Int. Cl.
*G06T 19/00*     (2011.01)
*G06Q 10/04*    (2012.01)
(Continued)

(52) U.S. Cl.
CPC ............ *G06T 19/006* (2013.01); *G06F 30/20* (2020.01); *G06Q 10/047* (2013.01); *G06Q 10/063* (2013.01); *G06F 3/011* (2013.01)

(58) Field of Classification Search
CPC .......................... G06T 19/006; G06F 17/5009
See application file for complete search history.

(56) References Cited

U.S. PATENT DOCUMENTS

2004/0059548 A1 *  3/2004  Kagarlis ............ G06F 17/5009
                                                                703/2
2009/0306946 A1 * 12/2009  Badler .................. G06N 3/004
                                                                703/2
(Continued)

FOREIGN PATENT DOCUMENTS

EP          3057014 A1 *  8/2016   ............. G06F 17/50

OTHER PUBLICATIONS

Balasubramanian, Vidhya, et al. "DrillSim: a simulation framework for emergency response drills." International Conference on Intelligence and Security Informatics. Springer, Berlin, Heidelberg, 2006. (Year: 2006).*

(Continued)

*Primary Examiner* — Ryan McCulley
(74) *Attorney, Agent, or Firm* — Mannava & Kang, P.C.

(57) ABSTRACT

In some examples, personnel movement simulation and control may include ascertaining, for a mixed reality simulator, attributes of a mixed reality simulation to be performed. The attributes may include an environment to be simulated, a personnel to be simulated, a holographic object to be included in the environment, and a goal of the mixed reality simulation. Personnel movement simulation and control may further include performing, based on the attributes, the mixed reality simulation. Further, personnel movement simulation and control may include determining, based on an analysis of the performed mixed reality simulation, an optimal path in the environment to meet the goal of the mixed reality simulation.

17 Claims, 8 Drawing Sheets

(51) Int. Cl.
*G06F 30/20* (2020.01)
*G06Q 10/06* (2012.01)
*G06F 3/01* (2006.01)

(56) References Cited

U.S. PATENT DOCUMENTS

2010/0066559 A1* 3/2010 Judelson ............... G06T 19/00
 340/8.1
2017/0322039 A1* 11/2017 Tadano ................. G01C 21/26
2018/0268326 A1* 9/2018 Aoki .................... G05B 17/02

OTHER PUBLICATIONS

Paul, Zikas, et al. "Life-sized Group and Crowd simulation in Mobile AR." Proceedings of the 29th International Conference on Computer Animation and Social Agents. ACM, 2016. (Year: 2016).*
Pellegrini, Stefano, et al. "Destination flow for crowd simulation." European Conference on Computer Vision. Springer, Berlin, Heidelberg, 2012. (Year: 2012).*
Vasudevan, Karthik, and Young-Jun Son. "Concurrent consideration of evacuation safety and productivity in manufacturing facility planning using multi-paradigm simulations." Computers & Industrial Engineering 61.4 (2011): 1135-1148. (Year: 2011).*
Li, Xiaomeng, et al. "Lattice gas simulation and experiment study of evacuation dynamics." Physica A: Statistical Mechanics and its Applications 387.22 (2008): 5457-5465. (Year: 2008).*
Kallianiotis, Anastasios, and Dimitrios Kaliampakos. "Evaluation of underground spaces evacuation effectiveness." Procedia Engineering 165 (2016): 564-574. (Year: 2016).*

* cited by examiner

700

ASCERTAIN, FOR A MIXED REALITY SIMULATOR, ATTRIBUTES OF A MIXED REALITY SIMULATION TO BE PERFORMED
702

GENERATE, FOR THE MIXED REALITY SIMULATION, A SPATIAL MAP OF A FLOOR SPACE THAT INCLUDES THE HOLOGRAPHIC OBJECT, AND AN EVACUATION SCENARIO FOR THE PERSONNEL TO BE SIMULATED IN THE SPATIAL MAP OF THE FLOOR SPACE
704

PERFORM, BASED ON THE ATTRIBUTES, THE MIXED REALITY SIMULATION
706

DETERMINE, BASED ON AN ANALYSIS OF THE PERFORMED MIXED REALITY SIMULATION, AN OPTIMAL PATH IN THE ENVIRONMENT TO MEET THE GOAL OF THE MIXED REALITY SIMULATION
708

FIG. 7

PERSONNEL MOVEMENT SIMULATION AND CONTROL

PRIORITY

This application is a Non-Provisional Application of commonly assigned and U.S. Provisional Application Ser. No. 62/535,710, filed Jul. 21, 2017, the disclosure of which is hereby incorporated by reference in its entirety.

BACKGROUND

In environments such as office buildings, shopping malls, airports, schools, sporting events, etc., personnel, which may include people generally, move between different locations to accomplish certain tasks or goals. For example, in an office building, in the event of a fire, personnel may move from their office location to an exit location with the goal of evacuating the office building. In an airport environment, personnel, which may include employees and travelers generally, may move from an airport entry to a check-in terminal, to security, and then to their specified gate for boarding and/or assisting with the boarding of an aircraft.

BRIEF DESCRIPTION OF DRAWINGS

Features of the present disclosure are illustrated by way of example and not limited in the following figure(s), in which like numerals indicate like elements, in which:

FIG. 7 illustrates a flowchart of an example method for personnel movement simulation and control in accordance with an example of the present disclosure.

DETAILED DESCRIPTION

Figure 1:
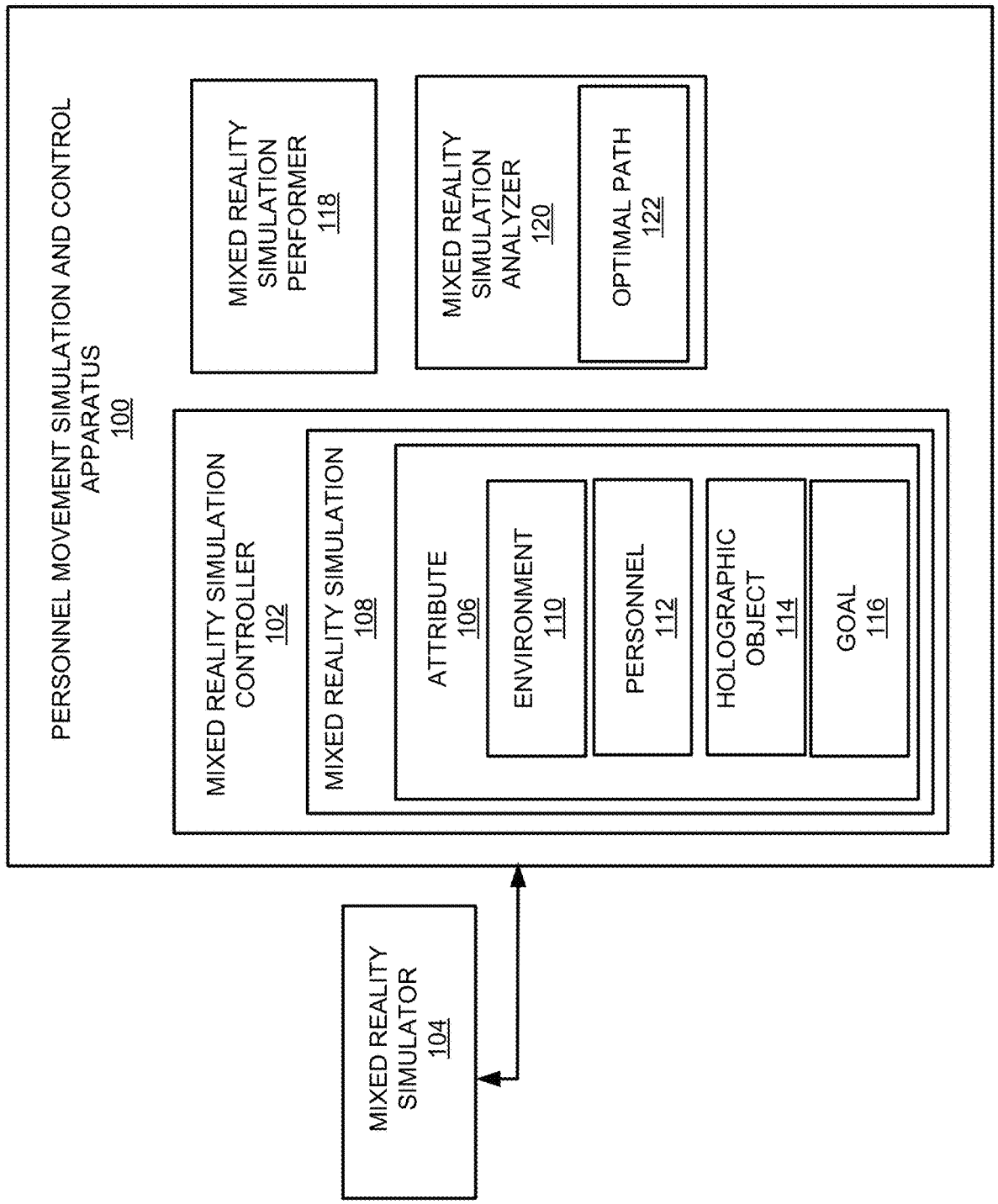
FIG. 1 illustrates a layout of a personnel movement simulation and control apparatus in accordance with an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Personnel movement simulation and control apparatuses, methods for personnel movement simulation and control, and non-transitory computer readable media having stored thereon machine readable instructions to provide personnel movement simulation and control are disclosed herein. The apparatuses, methods, and non-transitory computer readable media disclosed herein provide for ascertaining, for a mixed reality simulator, at least one attribute of a mixed reality simulation to be performed. The at least one attribute may include an environment to be simulated, a personnel to be simulated, a holographic object to be included in the environment, and/or a goal of the mixed reality simulation. The apparatuses, methods, and non-transitory computer readable media disclosed herein provide for performing, based on the at least one attribute, the mixed reality simulation. Further, the apparatuses, methods, and non-transitory computer readable media disclosed herein provide for determining, based on an analysis of the performed mixed reality simulation, an optimal path in the environment to meet the goal of the mixed reality simulation.

With respect to evacuation of personnel, for example, from an office building, companies invest in evacuation plans to provide a safe environment for evacuation of personnel in the event of a fire, an emergency, or for other reasons. In this regard, a company may implement an evacuation scenario where people may move in a calm and orderly manner to one or more exit locations. However technical challenges exist with adherence to evacuation plans. For example, a drawback in the calm and orderly scenario is that when a crisis occurs, people may not proceed to exit locations in a calm and orderly manner. Further, technical challenges exist in that an evacuation plan may not properly factor in people with pre-existing conditions and/or injuries, people who are injured during the evacuation, or the changing floor space of the location involved (e.g., fire/debris blocking path, irresponsible placement of assets in fire escape routes), which may prevent adherence to the evacuation plan.

In order to address at least these technical challenges, the apparatuses, methods, and non-transitory computer readable media disclosed herein provide a spatial mapping based approach that utilizes a mixed reality simulator to map out any floor space, simulate evacuation scenarios, and develop action plans to prevent loss of life or limb. An example of the mixed reality simulator may include the MICROSOFT HOLOLENS™. The apparatuses, methods, and non-transitory computer readable media disclosed herein may provide an adaptive and comprehensive analysis for administrators (e.g., building administrators) in evaluating and planning evacuation procedures per building area.

For the apparatuses, methods, and non-transitory computer readable media disclosed herein, an operator of the mixed reality simulator as disclosed herein may operate the mixed reality simulator, for example, by wearing the mixed reality simulator as glasses on their head, and map the environment by walking around a particular building that is to be evaluated. The operator may place personnel (e.g., holographic people) at different locations where people may be seated in a building, mark exit locations, and program the personnel to head towards the exit locations via various paths to determine an optimal path as disclosed herein. One path may include the shortest path for which various parameters are measured (e.g., time each personnel takes to traverse the path to an exit location, whether collisions occur, whether injuries occur, whether a personnel includes certain conditions (e.g., pregnant, etc.), whether the environment includes unanticipated objects, whether the environment includes unanticipated events such as fires, etc.

The apparatuses, methods, and non-transitory computer readable media disclosed herein may also be used for building (and other environment) planning. For example, a building may be planned based on a set of mixed reality simulations that include different environment layouts, different exit layouts, different procedures for personnel to move between different locations (e.g., such as in an airport), etc. In this regard, the apparatuses, methods, and non-transitory computer readable media disclosed herein may be used to plan the building (or environment generally) to generate optimal paths for personnel movement, whether the movement pertains to exiting in the event of a fire, or whether the movement pertains to performance of general operations (e.g., in an airport, etc.). In this manner, components (e.g., doors, desks, windows, etc.) of an environment may be adequately selected for placement, wear and tear, and/or reinforcement to account for movement of personnel.

The apparatuses, methods, and non-transitory computer readable media disclosed herein may also be used for general movement planning (e.g., crowd movement in sporting or concert events, general people movement, etc.), where the aspects of collision and injuries as disclosed herein for evacuation planning may be removed from the mixed reality simulation. In this regard, the results of the mixed reality simulation as disclosed herein may provide an indication of optimal paths for movement of people, where people stand between different events (e.g., obtaining a ticket and waiting for their turn at a driver's license facility), where people tend to congregate, etc.

With respect to spatial mapping as disclosed herein, the apparatuses, methods, and non-transitory computer readable media disclosed herein may identify a context of a simulation, determine the requirement of real and holographic objects, superimpose the real and holographic objects in a layout based on the context, and overlay the real and holographic objects by initially utilizing a spatial mapping feature of a mixed reality simulator. In this regard, permanent obstacles (e.g., walls, doors, columns, dividers, etc.) and temporary obstacles (e.g., chairs, tables, movable whiteboards, etc.) may be detected and distinguished. The permanent obstacles and temporary obstacles may be detected and distinguished by using the spatial mapping functionality of the mixed reality simulator. During simulations, permanent and temporary objects may no longer be distinguished as both may be treated as obstacles. However, temporary obstacles may be moved and reconfigured while simulations are not being executed. The permanent obstacles and the temporary obstacles may be used as the basis for identifying potential paths available for personnel evacuation. In this regard, potential paths may be determined, for example, by using a base A* search algorithm (for non progressive simulations), and customized A* search algorithms (for progressive simulations). Since spatial mapping is updated in real time, the spatial mapping configuration of the room may be updated in real time (e.g., by moving around movable objects) and thus enabling the process of identifying potential paths to be re-executed.

With respect to spatial mapping, holographic images may also act as obstacles during a simulation, which may be used to project crowding, trampling and funneling of evacuating personnel. In this regard, fleeing holographic personnel may be implemented using holographic models and animation. Colliders may be used to detect contact, and may trigger updates in health counters in health, and may also trigger collision (stumbling) animations. Fleeing holographic personnel and stationary holographic models (e.g., fires) may also be treated as obstacles, whereby a simulation may re-assess and update the recommended pathways. As disclosed herein, pathways may be determined by mapping the entire area and implementing the A* search algorithm for non-progressive simulations, and customized A* search algorithms for progressive simulations.

With respect to utilization of data gathered from spatial mapping, spatial mapping may provide the precise geolocation of real world objects. Data from spatial mapping may be combined with data used in simulated holograms. In this regard, spatial mapping data may be combined with data from holograms by placing the holograms in the same spatial mapping application to generate holographic data. With respect to logging data, locations and statuses of holograms may be logged in a Structured Query Language (SQL) database for reporting and analysis purposes. Spatial mapping data may be used as indirect parameters in determining the pathways available for simulation. In this regard, spatial mapping data may determine which pathways are passable and which pathways are not. Thus, spatial mapping data may determine the path options.

With respect to operation of a machine learning model in the progressive simulation as disclosed herein, progressive simulation may execute multiple simulations on a specific area configuration. Each simulation may apply different biases to the behavior of holographic personnel (e.g., a bias may favor a certain direction for a single simulation). Thus, progressive simulation may favor multiple directions across multiple simulations. With the data collected from a simulation and data from previous simulations, progressive simulation may utilize a machine learning model through a mixed reality simulation analyzer as disclosed herein to generate a recommended path (e.g., an optimal path as disclosed herein) after considering the time it takes for a crowd to evacuate, and the amount of simulated damage (e.g., pathways where people will be physically hurt in the simulation will be ranked lower in the recommendations).

With respect to operation of the path finding algorithms as disclosed herein, a base path finding algorithm may include the A* search algorithm, which may be implemented with no modifications for non-progressive simulations. However different biases (depending on the physical configuration of an area) may be applied, and thus, the A* algorithm may be modified if a different algorithm is to be utilized during a simulation. For example, the A* algorithm may be overridden and customized by plotting biases such as bias left (where pathways to the left are prioritized), bias right, front bias left (30% of the holographic population closer to the exit will only prioritize left), front bias right, middle bias left (30% of middle holographic population will prioritize left), middle bias right, rear bias left (30% of farthest holograms from the target will prioritize left pathways), and rear bias right in addition to the general A* algorithm. Data from all of these simulations may be collected and the mixed reality simulation analyzer as disclosed herein may recommend a proper pathway based, for example, on the health of holograms and the time it takes for the simulation to complete. According to an example, the pathway followed may no longer be the A* algorithm, but may be a customized version of the A* algorithm generated by the machine learning model as disclosed herein.

For the apparatuses, methods, and non-transitory computer readable media disclosed herein, the elements of the apparatuses, methods, and non-transitory computer readable media disclosed herein may be any combination of hardware and programming to implement the functionalities of the respective elements. In some examples described herein, the combinations of hardware and programming may be implemented in a number of different ways. For example, the programming for the elements may be processor executable instructions stored on a non-transitory machine-readable storage medium and the hardware for the elements may include a processing resource to execute those instructions. In these examples, a computing device implementing such elements may include the machine-readable storage medium storing the instructions and the processing resource to execute the instructions, or the machine-readable storage medium may be separately stored and accessible by the computing device and the processing resource. In some examples, some elements may be implemented in circuitry.

FIG. 1 illustrates a layout of an example personnel movement simulation and control apparatus (hereinafter also referred to as "apparatus 100").

Referring to FIG. 1, the apparatus 100 may include a mixed reality simulation controller 102 that is executed by at least one hardware processor (e.g., the hardware processor 602 of FIG. 6, and/or the hardware processor 804 of FIG. 8) to ascertain, for a mixed reality simulator 104, at least one attribute 106 of a mixed reality simulation 108 to be performed. The at least one attribute 106 may include an environment 110 to be simulated, a personnel 112 to be simulated, a holographic object 114 to be included in the environment 110, and/or a goal 116 of the mixed reality simulation 108.

According to examples disclosed herein, the mixed reality simulation controller 102 may generate, for the mixed reality simulation, a spatial map of a floor space that includes the holographic object, and an evacuation scenario for the personnel to be simulated in the spatial map of the floor space.

According to examples disclosed herein, the mixed reality simulation controller 102 may generate, for the mixed reality simulation, a spatial map of a floor space that includes the holographic object, and a movement scenario for the personnel to be simulated in the spatial map of the floor space.

A mixed reality simulation performer 118 that is executed by at least one hardware processor (e.g., the hardware processor 602 of FIG. 6, and/or the hardware processor 804 of FIG. 8) is to perform, based on the at least one attribute 106, the mixed reality simulation 108.

A mixed reality simulation analyzer 120 that is executed by at least one hardware processor (e.g., the hardware processor 602 of FIG. 6, and/or the hardware processor 804 of FIG. 8) is to determine, based on an analysis of the performed mixed reality simulation 108, an optimal path 122 in the environment 110 to meet the goal 116 of the mixed reality simulation 108.

According to examples disclosed herein, the mixed reality simulation analyzer 120 may determine, based on the analysis of the performed mixed reality simulation, the optimal path in the environment to meet the goal of the mixed reality simulation by determining, for each path of a plurality of paths in the environment, a time that it takes the personnel to evacuate the floor space, and identifying a path of the plurality of paths that corresponds to a shortest time that it takes the personnel to evacuate the floor space.

According to examples disclosed herein, the mixed reality simulation analyzer 120 may determine, based on the analysis of the performed mixed reality simulation, the optimal path in the environment to meet the goal of the mixed reality simulation by determining, for each path of a plurality of paths in the environment, a time that it takes the personnel to evacuate the floor space, determining, for each path of the plurality of paths in the environment, a number of collisions incurred by the personnel during the evacuation of the floor space, and identifying a path of the plurality of paths based on the time that it takes the personnel to evacuate the floor space and the number of collisions incurred by the personnel during the evacuation of the floor space.

According to examples disclosed herein, the mixed reality simulation analyzer 120 may determine, based on the analysis of the performed mixed reality simulation, the optimal path in the environment to meet the goal of the mixed reality simulation by determining, for each path of a plurality of paths in the environment, a time that it takes the personnel to move within the floor space, identifying a path of the plurality of paths that corresponds to a shortest time that it takes the personnel to move within the floor space, and generating, based on the path of the plurality of paths that corresponds to the shortest time that it takes the personnel to move within the floor space, a layout of paths and objects within the environment.

According to examples disclosed herein, the mixed reality simulation performer 118 may perform, based on the attributes, the mixed reality simulation, and the mixed reality simulation analyzer 120 may determine, based on the analysis of the performed mixed reality simulation, the optimal path in the environment to meet the goal of the mixed reality simulation by implementing a plurality of progressive mixed reality simulations, each mixed reality simulation of the plurality of progressive mixed reality simulations including a different bias with respect to the personnel to be simulated, and determining, based on the analysis of each performed mixed reality simulation of the plurality of progressive mixed reality simulations, the optimal path in the environment to meet the goal of the plurality of progressive mixed reality simulations.

According to examples disclosed herein, the different bias may be selected from a set of biases that includes bias left, bias right, front bias left, front bias right, middle bias left, middle bias right, rear bias left, and rear bias right.

According to examples disclosed herein, the mixed reality simulation analyzer 120 may determine, based on the analysis of the performed mixed reality simulation, a safety rating, from a plurality of safety ratings, associated with the optimal path in the environment to meet the goal of the mixed reality simulation.

According to examples disclosed herein, the attributes may further include a number of collisions associated with the personnel to be simulated before the personnel is designated as being injured, and the mixed reality simulation analyzer 120 may determine, based on the analysis of the performed mixed reality simulation, a safety rating, from a plurality of safety ratings, associated with the optimal path in the environment to meet the goal of the mixed reality simulation by assigning a negative safety rating factor to the safety rating for the personnel based on a number of collisions incurred by the personnel.

According to examples disclosed herein, the attributes may further include a speed associated with the personnel to be simulated, and the mixed reality simulation analyzer 120 may determine, based on the analysis of the performed mixed reality simulation, the optimal path in the environment to meet the goal of the mixed reality simulation by analyzing, based on the speed associated with the personnel to be simulated, the performed mixed reality simulation to determine the optimal path in the environment to meet the goal of the mixed reality simulation.

Referring again to FIG. 1, the apparatus 100 may allow a user (e.g., a building administrator) to create simulated evacuation runs by leveraging the spatial mapping provided by the mixed reality simulator 104. During setup, a user may position different holographic people (e.g., the personnel 112), obstacles (e.g., the holographic object 114), and exit destinations. The holographic people may employ a path-finding algorithm to find a route to the exit destination, avoiding both real-world and holographic obstacles along the way. At the end of the mixed reality simulation 108, a safety rating may be shown based on different factors that occurred during the simulation. For example, the safety rating may be specified on a scale of 1-100, where a rating below 20 represents unsafe, a rating between 20-50 represents moderately unsafe, a rating between 50-70 represents moderately safe, and a rating above 70 represents safe. The safety rating may be specified in other scales as well, such as 0-1, letter-based scale, etc. The safety rating may also represent a standard that is to be met for rating a particular building (or another environment) with respect to evacuation or movement safety.

With respect to the mixed reality simulation performer 118, the holographic people (e.g., the personnel 112) may include a collision detector component of the mixed reality simulation performer 118 that tracks collisions with one another. Each holographic person may sustain a set amount of collisions before they become injured. Both collision and injured holographic persons may be assigned a negative impact on the safety rating of the mixed reality simulation 108. The safety rating may be determined as follows:

$$\frac{1}{n}\sum_{i=1}^{n}\left(\sqrt[3]{\frac{SpdActual_i \times Time_i}{SpdMax_i \times Time_i}} - \sqrt{\frac{Collision_i}{Time_i}}\right)$$

The mixed reality simulation performer 118 may implement two modes with respect to the mixed reality simulations, one designated single simulation, and the other designated progressive simulation.

Figure 2:
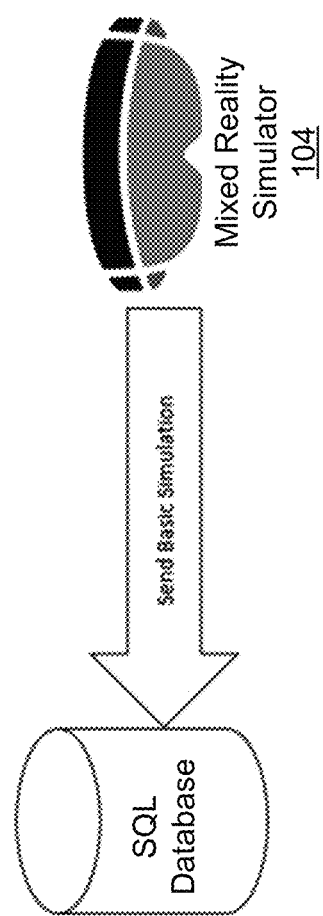
FIG. 2 illustrates implementation of a single simulation to illustrate operation of the personnel movement simulation and control apparatus of FIG. 1 in accordance with an example of the present disclosure.

FIG. 2 illustrates implementation of a single simulation to illustrate operation of the apparatus 100 in accordance with an example of the present disclosure.

Referring to FIG. 2, in the single simulation mode, the mixed reality simulation performer 118 may execute the mixed reality simulation 108 once. Further, the mixed reality simulation performer 118 may send all pertinent data of the mixed reality simulation 108 including the details of the holographic people to a SQL database for further processing or for reporting purposes. An example of a SQL database may include the AZURE™ SQL database.

Figure 3:
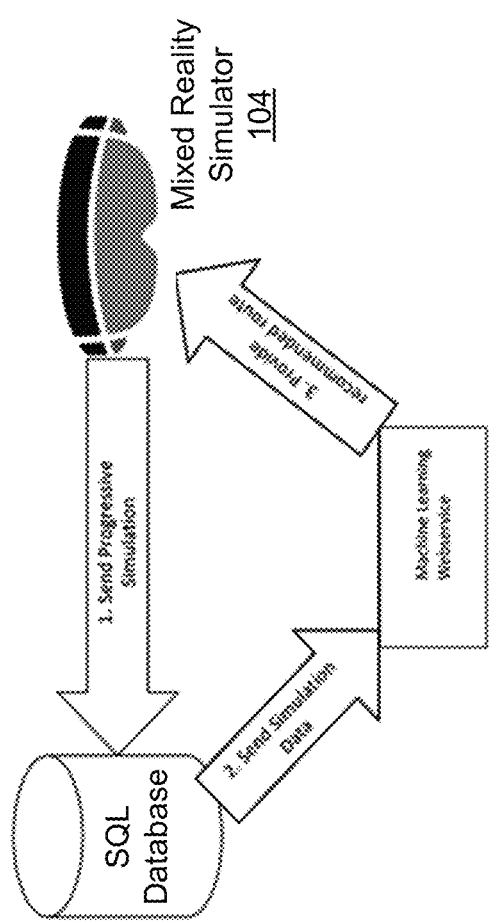
FIG. 3 illustrates implementation of a progressive simulation to illustrate operation of the personnel movement simulation and control apparatus of FIG. 1 in accordance with an example of the present disclosure.

FIG. 3 illustrates implementation of a progressive simulation to illustrate operation of the apparatus 100 in accordance with an example of the present disclosure.

Referring to FIG. 3, in progressive simulation, the mixed reality simulation performer 118 may execute a plurality of simulations (e.g., eleven simulations) using different pathing algorithms, and send the data gathered in the simulations to a SQL database. Each progressive simulation may represent a different simulation with different paths and circumstances. Thereafter, the data may be passed through a machine learning algorithm (e.g., the machine learning webservice of FIG. 3) to determine the best run based on collision count and simulation speed. The machine learning algorithm may be a component of the mixed reality simulation analyzer 120. Upon request from the mixed reality simulator 104, the mixed reality simulation analyzer 120 may forward the best run (e.g., least collision count, fastest speed, etc.), which may be designated as the optimal path 122, as a recommendation to the mixed reality simulator 104. The machine learning algorithm may thus output, based on the analysis of the various factors described above, the optimal path 122 for the particular attributes of the mixed reality simulation 108. That is, the greater the number of simulations, the machine learning algorithm may learn from each mixed reality simulation 108 how different aspects of the environment 110, the personnel 112, holographic objects, and other factors affect the outcome of a mixed reality simulation 108.

Figure 4:
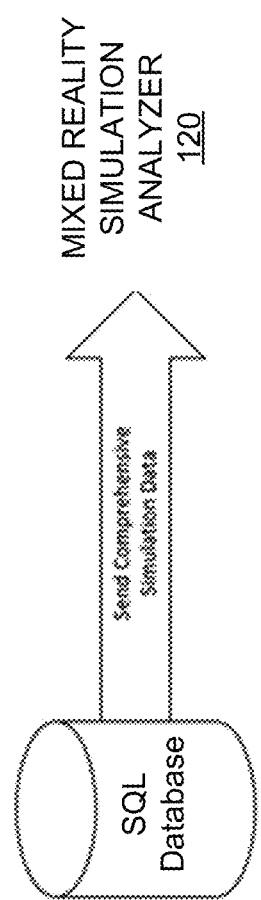
FIG. 4 illustrates reporting to illustrate operation of the personnel movement simulation and control apparatus of FIG. 1 in accordance with an example of the present disclosure.

FIG. 4 illustrates reporting to illustrate operation of the apparatus 100 in accordance with an example of the present disclosure.

Figure 5:
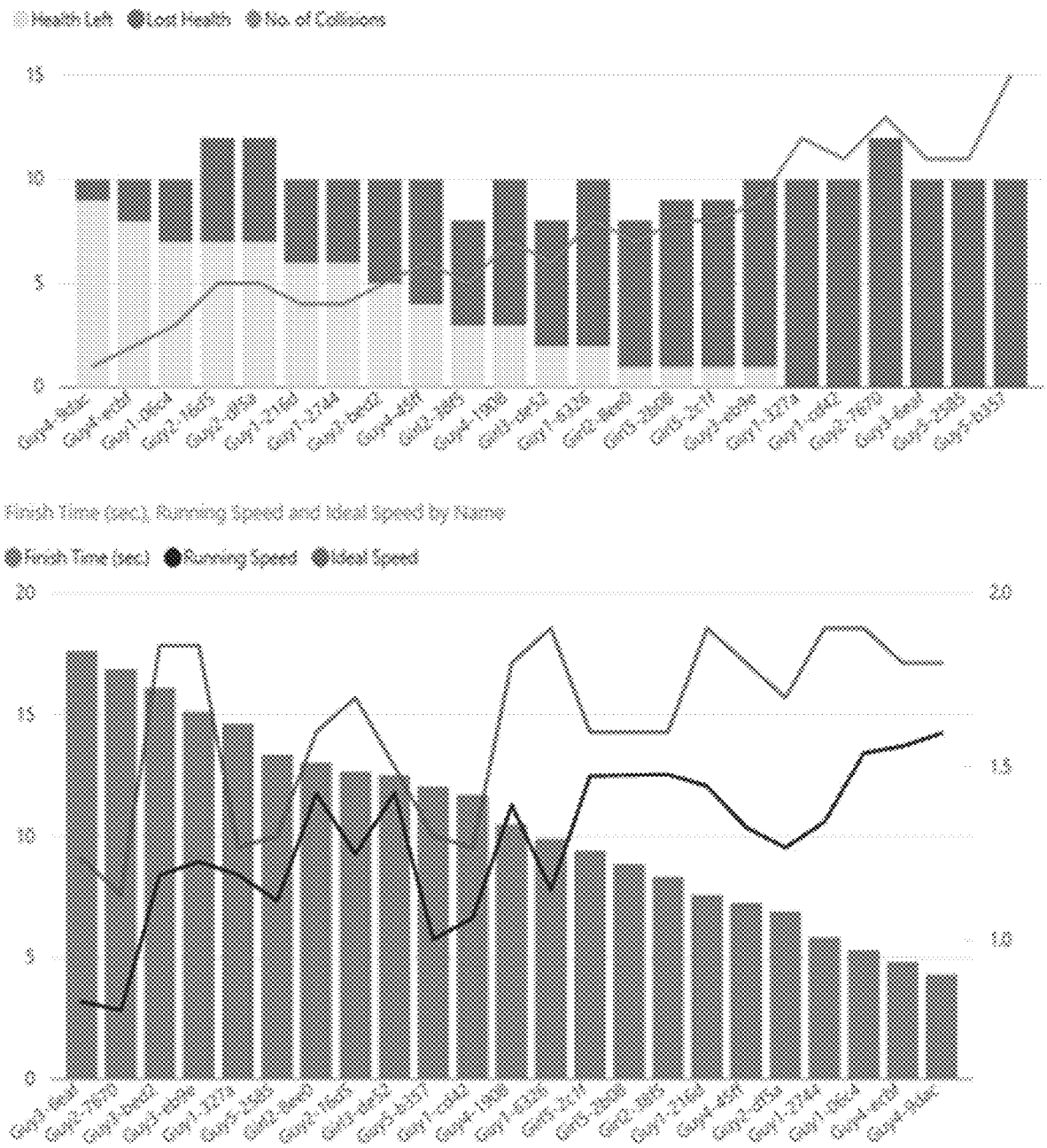
FIG. 5 illustrates a report to illustrate operation of the personnel movement simulation and control apparatus of FIG. 1 in accordance with an example of the present disclosure.

Referring to FIG. 4, with respect to the data stored in the SQL database (e.g., see FIGS. 2 and 3), the mixed reality simulation analyzer 120 may process and generate an illustration of the data to show the performance of each simulation based on the statistics of each holographic person in the mixed reality simulation 108. For example, the mixed reality simulation analyzer 120 may generate graphs that show the number of collisions, the number of injured, the amount of time they needed to reach the exit destination, and the difference between their actual speed and their ideal speed. An example of a report is illustrated in FIG. 5.

Referring again to FIG. 1, the mixed reality simulation performer 118 may utilize the spatial location feature of the mixed reality simulator 104 as the mixed reality simulator 104 captures the layout of the environment 110. The spatial location may update in real-time, even if a real object is placed in what used to be a path. Aside from being able to detect real objects, the mixed reality simulation controller 102 may add holographic obstacles, such as a fire, to block the holographic people along the way, etc., for the mixed reality simulation 108. The mixed reality simulation controller 102 may also add multiple exit destinations that would indicate where the holographic people will aim to move towards. These destinations may be marked as actual fire exits or even "safe zone" where the fire exit is close by.

With respect to the personnel 112, the personnel 112 may be added into the environment 110 via voice commands. These personnel 112 may be patterned to typical features of males, females, children, etc., and include different body shapes and age ranges. The goal 116 of the personnel 112 may be specified to find a path to the exit the environment 110 while avoiding real and holographic obstacles. Each holographic person (e.g., the personnel 112) may collide with one another, which triggers a collision animation, and after a few collisions, a status of an appropriate personnel 112 may be changed to injured, where an attribute of the appropriate personnel 112 may be modified to run slower. The amount of collisions a holographic person may take before getting injured may be denoted their health.

With respect voice control of the mixed reality simulation 108, once the mixed reality simulator 104 maps the environment 110 for the mixed reality simulation 108, voice commands may be used to setup the mixed reality simulation 108.

A voice command may include "add male" or "add female" to add a holographic person with average health (e.g., the amount of collisions a holographic person may take before getting injured) and speed. A user may air-tap a location in the environment 110 to place the holographic person. The holographic person may be replaced by air-tapping them, and placing them in another location.

Another voice command may include "add elderly" to add a holographic person with lower health (e.g., the amount of collisions a holographic person may take before getting injured) and speed.

Another voice command may include "add child" to add a holographic person with lower health (e.g., the amount of collisions a holographic person may take before getting injured) and low speed.

Another voice command may include "add teenager" to add a holographic person with lower health (e.g., the amount of collisions a holographic person may take before getting injured) but high speed.

Another voice command may include "add destination" to add an exit destination where all the holographic people will move to once the mixed reality simulation 108 starts.

Another voice command may include "add fire" to add a holographic fire which acts as an obstacle for holographic people to avoid.

Another voice command may include "add Marshall" to add a holographic person blocking off certain areas to prevent other holographic people from entering. The Marshall may have to evacuate as well after all holographic people are closer to the exit.

Another voice command may include "add threat" to add a holographic person which acts as a roaming threat that other holographic people must avoid while moving to the exit, otherwise the holographic person may be severely injured if they come to contact with the threat. The threat may not need to evacuate during the mixed reality simulation 108.

Another voice command may include "remove" to remove a selected hologram, where a user may air-tap the hologram before invoking "remove".

Another voice command may include "start simulation" to start the mixed reality simulation 108 prompting holographic people to move according to their programming. For the mixed reality simulation 108 to execute, there may be a holographic person, except "threat", present and a destination.

Another voice command may include "end simulation" to stop the mixed reality simulation 108, and reset holograms back to their original places.

Another voice command may include "pause" to freeze the mixed reality simulation 108.

Another voice command may include "play" to resume the mixed reality simulation 108 after a "pause" was invoked.

Another voice command may include "show menu" to show the menu to set progressive simulation or single simulation, and to set the connection to the SQL database.

Another voice command may include "hide menu" to hide the menu after a "show menu" is invoked.

Another voice command may include "reset map" to remove all holograms from the location.

Figure 6:
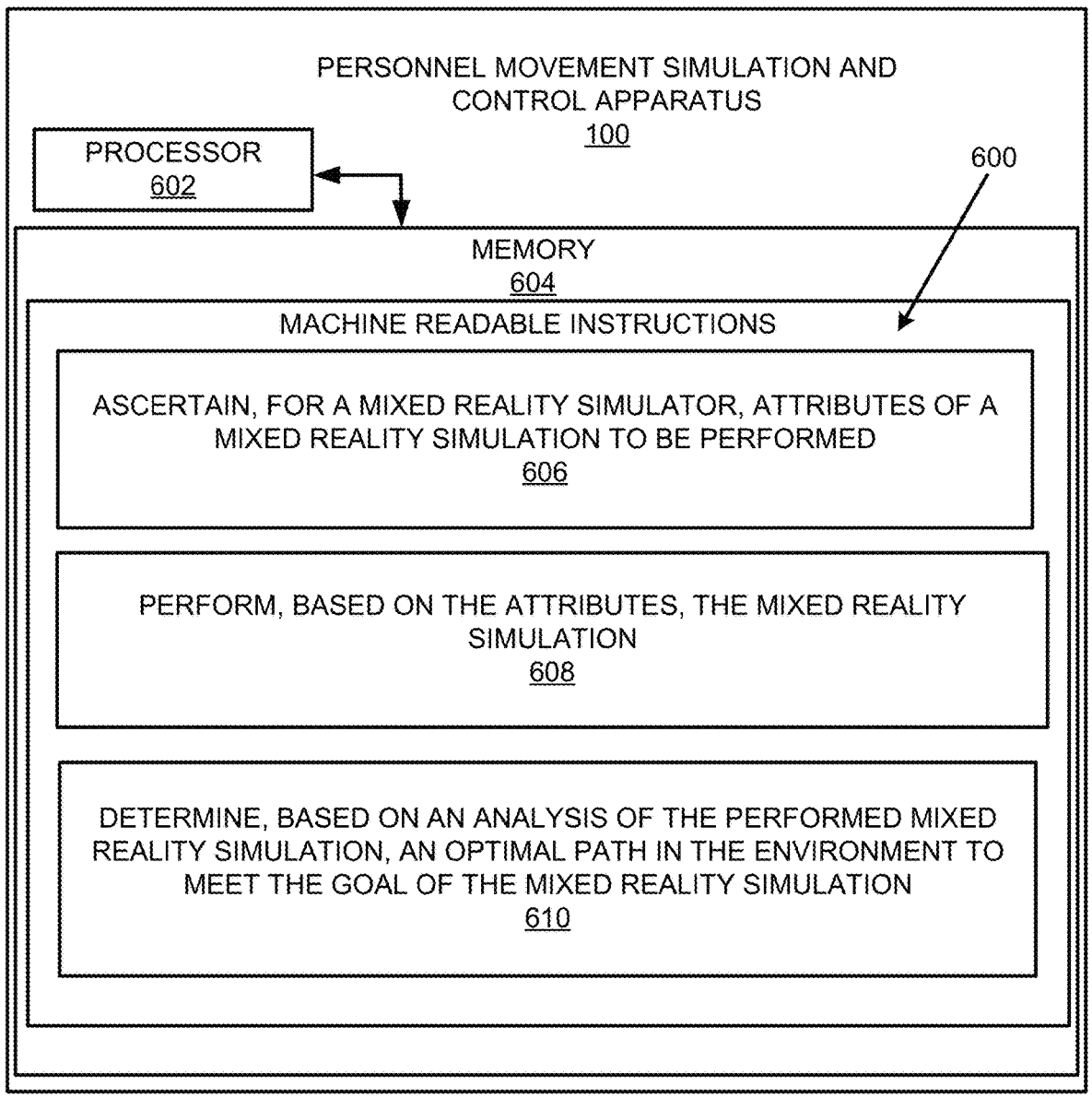
FIG. 6 illustrates an example block diagram for personnel movement simulation and control in accordance with an example of the present disclosure.
Figure 8:
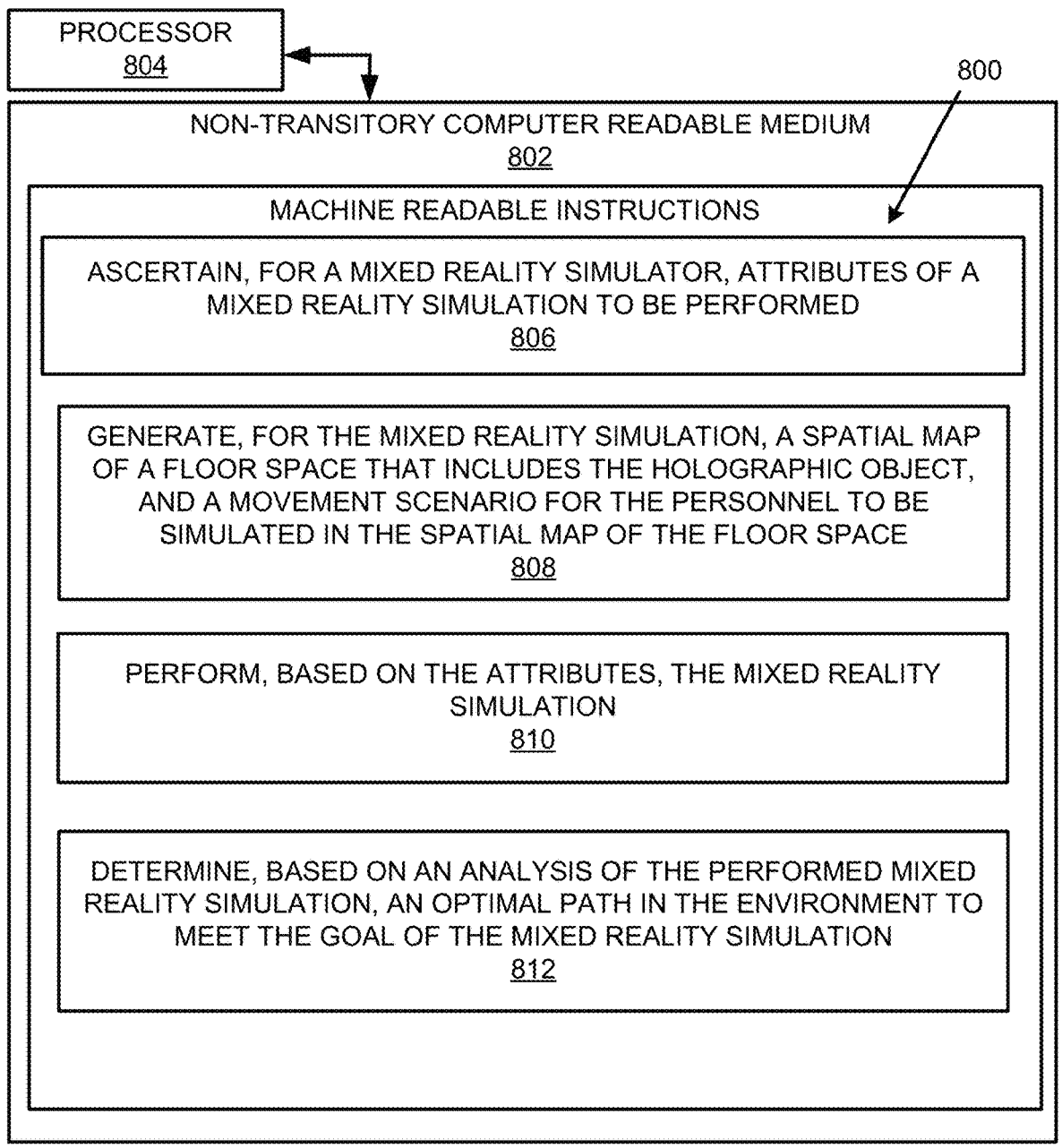
FIG. 8 illustrates a further example block diagram for personnel movement simulation and control in accordance with another example of the present disclosure.

FIGS. 6-8 respectively illustrate an example block diagram 600, a flowchart of an example method 700, and a further example block diagram 800 for personnel movement simulation and control, according to examples. The block diagram 600, the method 700, and the block diagram 800 may be implemented on the apparatus 100 described above with reference to FIG. 1 by way of example and not of limitation. The block diagram 600, the method 700, and the block diagram 800 may be practiced in other apparatus. In addition to showing the block diagram 600, FIG. 6 shows hardware of the apparatus 100 that may execute the instructions of the block diagram 600. The hardware may include a processor 602, and a memory 604 storing machine readable instructions that when executed by the processor cause the processor to perform the instructions of the block diagram 600. The memory 604 may represent a non-transitory computer readable medium. FIG. 7 may represent an example method for personnel movement simulation and control, and the steps of the method. FIG. 8 may represent a non-transitory computer readable medium 802 having stored thereon machine readable instructions to provide personnel movement simulation and control according to an example. The machine readable instructions, when executed, cause a processor 804 to perform the instructions of the block diagram 800 also shown in FIG. 8.

The processor 802 of FIG. 8 and/or the processor 604 of FIG. 6 may include a single or multiple processors or other hardware processing circuit, to execute the methods, functions and other processes described herein. These methods, functions and other processes may be embodied as machine readable instructions stored on a computer readable medium, which may be non-transitory (e.g., the non-transitory computer readable medium 802 of FIG. 8), such as hardware storage devices (e.g., RAM (random access memory), ROM (read only memory), EPROM (erasable, programmable ROM), EEPROM (electrically erasable, programmable ROM), hard drives, and flash memory). The memory 604 may include a RAM, where the machine readable instructions and data for a processor may reside during runtime.

Referring to FIGS. 1-6, and particularly to the block diagram 600 shown in FIG. 6, the memory 604 may include instructions 606 to ascertain, for a mixed reality simulator, attributes of a mixed reality simulation to be performed. Examples of attributes may include an environment to be simulated, a personnel to be simulated, a holographic object to be included in the environment, and a goal of the mixed reality simulation.

The processor 602 may fetch, decode, and execute the instructions 608 to perform, based on the attributes, the mixed reality simulation.

The processor 602 may fetch, decode, and execute the instructions 610 to determine, based on an analysis of the performed mixed reality simulation, an optimal path in the environment to meet the goal of the mixed reality simulation.

Referring to FIGS. 1-5 and 7, and particularly FIG. 7, for the method 700, at block 702, the method may include ascertaining, for a mixed reality simulator, attributes of a mixed reality simulation to be performed.

At block 704, the method may include generating, for the mixed reality simulation, a spatial map of a floor space that includes the holographic object, and an evacuation scenario for the personnel to be simulated in the spatial map of the floor space.

At block 706, the method may include performing, based on the attributes, the mixed reality simulation.

At block 708, the method may include determining, based on an analysis of the performed mixed reality simulation, an optimal path in the environment to meet the goal of the mixed reality simulation.

Referring to FIGS. 1-5 and 8, and particularly FIG. 8, for the block diagram 800, the non-transitory computer readable medium 802 may include instructions 806 to ascertain, for a mixed reality simulator, attributes of a mixed reality simulation to be performed.

The processor 804 may fetch, decode, and execute the instructions 808 to generate, for the mixed reality simulation, a spatial map of a floor space that includes the holographic object, and a movement scenario for the personnel to be simulated in the spatial map of the floor space.

The processor 804 may fetch, decode, and execute the instructions 810 to perform, based on the attributes, the mixed reality simulation.

The processor 804 may fetch, decode, and execute the instructions 812 to determine, based on an analysis of the performed mixed reality simulation, an optimal path in the environment to meet the goal of the mixed reality simulation.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A personnel movement simulation and control apparatus comprising:
   a mixed reality simulation controller, executed by at least one hardware processor, to
      ascertain, for a mixed reality simulator, attributes of a mixed reality simulation to be performed, wherein the attributes include
         an environment to be simulated,
         a personnel to be simulated,
         a holographic object to be included in the environment, and
         a goal of the mixed reality simulation;
   a mixed reality simulation performer, executed by the at least one hardware processor, to
      perform, based on the attributes, the mixed reality simulation; and
   a mixed reality simulation analyzer, executed by the at least one hardware processor, to
      determine, based on an analysis of the performed mixed reality simulation, an optimal path in the environment to meet the goal of the mixed reality simulation,
      determine, based on the analysis of the performed mixed reality simulation, a safety rating, from a plurality of safety ratings that correspond to different safety levels, associated with the optimal path in the environment to meet the goal of the mixed reality simulation by assigning a negative safety rating factor to the safety rating for the personnel based on a configurable number of collisions incurred by the personnel, and
      designate, based on the configurable number of collisions incurred by the personnel, the personnel as being injured.

2. The personnel movement simulation and control apparatus according to claim 1, wherein the mixed reality simulation controller is executed by the at least one hardware processor to:
   generate, for the mixed reality simulation,
      a spatial map of a floor space that includes the holographic object, and
      an evacuation scenario for the personnel to be simulated in the spatial map of the floor space.

3. The personnel movement simulation and control apparatus according to claim 2, wherein the mixed reality simulation analyzer is executed by the at least one hardware processor to determine, based on the analysis of the performed mixed reality simulation, the optimal path in the environment to meet the goal of the mixed reality simulation by:
   determining, for each path of a plurality of paths in the environment, a time that it takes the personnel to evacuate the floor space; and
   identifying a path of the plurality of paths that corresponds to a shortest time that it takes the personnel to evacuate the floor space.

4. The personnel movement simulation and control apparatus according to claim 2, wherein the mixed reality simulation analyzer is executed by the at least one hardware processor to determine, based on the analysis of the performed mixed reality simulation, the optimal path in the environment to meet the goal of the mixed reality simulation by:
   determining, for each path of a plurality of paths in the environment, a time that it takes the personnel to evacuate the floor space;
   determining, for each path of the plurality of paths in the environment, a number of collisions incurred by the personnel during the evacuation of the floor space; and
   identifying a path of the plurality of paths based on the time that it takes the personnel to evacuate the floor space and the number of collisions incurred by the personnel during the evacuation of the floor space.

5. The personnel movement simulation and control apparatus according to claim 1, wherein the mixed reality simulation controller is executed by the at least one hardware processor to:
   generate, for the mixed reality simulation,
      a spatial map of a floor space that includes the holographic object, and
      a movement scenario for the personnel to be simulated in the spatial map of the floor space.

6. The personnel movement simulation and control apparatus according to claim 5, wherein the mixed reality simulation analyzer is executed by the at least one hardware processor to determine, based on the analysis of the performed mixed reality simulation, the optimal path in the environment to meet the goal of the mixed reality simulation by:
   determining, for each path of a plurality of paths in the environment, a time that it takes the personnel to move within the floor space;
   identifying a path of the plurality of paths that corresponds to a shortest time that it takes the personnel to move within the floor space; and
   generating, based on the path of the plurality of paths that corresponds to the shortest time that it takes the personnel to move within the floor space, a layout of paths and objects within the environment.

7. The personnel movement simulation and control apparatus according to claim 1, wherein the mixed reality simulation performer is executed by the at least one hardware processor to perform, based on the attributes, the mixed reality simulation, and the mixed reality simulation analyzer is executed by the at least one hardware processor to determine, based on the analysis of the performed mixed reality simulation, the optimal path in the environment to meet the goal of the mixed reality simulation by:

implementing a plurality of progressive mixed reality simulations, each mixed reality simulation of the plurality of progressive mixed reality simulations including a simulation-wide bias associated with a direction of movement with respect to the personnel to be simulated; and determining, based on the analysis of each performed mixed reality simulation of the plurality of progressive mixed reality simulations, the optimal path in the environment to meet the goal of the plurality of progressive mixed reality simulations.

8. The personnel movement simulation and control apparatus according to claim 7, wherein the simulation-wide bias is selected from a set of biases that includes bias left, bias right, front bias left, front bias right, middle bias left, middle bias right, rear bias left, and rear bias right.

9. The personnel movement simulation and control apparatus according to claim 1, wherein the attributes further include a speed associated with the personnel to be simulated, and wherein the mixed reality simulation analyzer is executed by the at least one hardware processor to determine, based on the analysis of the performed mixed reality simulation, the optimal path in the environment to meet the goal of the mixed reality simulation by:

analyzing, based on the speed associated with the personnel to be simulated, the performed mixed reality simulation to determine the optimal path in the environment to meet the goal of the mixed reality simulation.

10. A method for personnel movement simulation and control comprising:

ascertaining, by at least one hardware processor, for a mixed reality simulator, attributes of a mixed reality simulation to be performed, wherein the attributes include
an environment to be simulated,
a personnel to be simulated,
a holographic object to be included in the environment, and
a goal of the mixed reality simulation;

generating, by the at least one hardware processor and for the mixed reality simulation,
a spatial map of a floor space that includes the holographic object, and
an evacuation scenario for the personnel to be simulated in the spatial map of the floor space;

performing, by the at least one hardware processor and based on the attributes, the mixed reality simulation;

determining, by the at least one hardware processor and based on an analysis of the performed mixed reality simulation, an optimal path in the environment to meet the goal of the mixed reality simulation;

determining, by the at least one hardware processor and based on the analysis of the performed mixed reality simulation, a safety rating, from a plurality of safety ratings that correspond to different safety levels, associated with the optimal path in the environment to meet the goal of the mixed reality simulation by assigning a negative safety rating factor to the safety rating for the personnel based on a configurable number of collisions incurred by the personnel; and designating, by the at least one hardware processor, based on the configurable number of collisions incurred by the personnel, the personnel as being injured.

11. The method according to claim 10, wherein determining, based on the analysis of the performed mixed reality simulation, the optimal path in the environment to meet the goal of the mixed reality simulation further comprises:

determining, for each path of a plurality of paths in the environment, a time that it takes the personnel to evacuate the floor space; and identifying a path of the plurality of paths that corresponds to a shortest time that it takes the personnel to evacuate the floor space.

12. The method according to claim 10, wherein determining, based on the analysis of the performed mixed reality simulation, the optimal path in the environment to meet the goal of the mixed reality simulation further comprises:

determining, for each path of a plurality of paths in the environment, a time that it takes the personnel to evacuate the floor space;

determining, for each path of the plurality of paths in the environment, a number of collisions incurred by the personnel during the evacuation of the floor space; and identifying a path of the plurality of paths based on the time that it takes the personnel to evacuate the floor space and the number of collisions incurred by the personnel during the evacuation of the floor space.

13. The method according to claim 10, wherein performing, based on the attributes, the mixed reality simulation, and determining, based on the analysis of the performed mixed reality simulation, the optimal path in the environment to meet the goal of the mixed reality simulation further comprises:

implementing a plurality of progressive mixed reality simulations, each mixed reality simulation of the plurality of progressive mixed reality simulations including a simulation-wide bias associated with a direction of movement with respect to the personnel to be simulated; and determining, based on the analysis of each performed mixed reality simulation of the plurality of progressive mixed reality simulations, the optimal path in the environment to meet the goal of the plurality of progressive mixed reality simulations.

14. The method according to claim 13, wherein the simulation-wide bias is selected from a set of biases that includes bias left, bias right, front bias left, front bias right, middle bias left, middle bias right, rear bias left, and rear bias right.

15. A non-transitory computer readable medium having stored thereon machine readable instructions, the machine readable instructions, when executed by at least one hardware processor, cause the at least one hardware processor to:

ascertain, for a mixed reality simulator, attributes of a mixed reality simulation to be performed, wherein the attributes include
an environment to be simulated,
a personnel to be simulated,
a holographic object to be included in the environment, and
a goal of the mixed reality simulation;

generate, for the mixed reality simulation,
a spatial map of a floor space that includes the holographic object, and
a movement scenario for the personnel to be simulated in the spatial map of the floor space;

perform, based on the attributes, the mixed reality simulation;

determine, based on an analysis of the performed mixed reality simulation, an optimal path in the environment to meet the goal of the mixed reality simulation;

determine, based on the analysis of the performed mixed reality simulation, a safety rating, from a plurality of safety ratings that correspond to different safety levels, associated with the optimal path in the environment to meet the goal of the mixed reality simulation; and implement a simulation-wide bias associated with a direction of movement with respect to the personnel to be simulated, wherein the simulation-wide bias is selected from a set of biases that includes bias left, bias right, front bias left, front bias right, middle bias left, middle bias right, rear bias left, and rear bias right, and wherein a direction of the bias is relative to the direction of movement of the personnel to be simulated.

16. The non-transitory computer readable medium according to claim 15, wherein the machine readable instructions, when executed by the at least one hardware processor, further cause the at least one hardware processor to:

determine, based on the analysis of the performed mixed reality simulation, the safety rating, from the plurality of safety ratings, associated with the optimal path in the environment to meet the goal of the mixed reality simulation by assigning a negative safety rating factor to the safety rating for the personnel based on a configurable number of collisions incurred by the personnel; and designate, based on the configurable number of collisions incurred by the personnel, the personnel as being injured.

17. The non-transitory computer readable medium according to claim 15, wherein the attributes further include a speed associated with the personnel to be simulated, and wherein the machine readable instructions to determine, based on the analysis of the performed mixed reality simulation, the optimal path in the environment to meet the goal of the mixed reality simulation, when executed by the at least one hardware processor, further cause the at least one hardware processor to:

analyze, based on the speed associated with the personnel to be simulated, the performed mixed reality simulation to determine the optimal path in the environment to meet the goal of the mixed reality simulation.

\* \* \* \* \*